United States Patent [19]
Farley

[11] Patent Number: 5,875,085
[45] Date of Patent: Feb. 23, 1999

[54] LITHIUM ELECTRONIC-MECHANICAL AUTOMATIC PROTECTION SYSTEM (LEAPS)

[75] Inventor: Joseph Farley, Villeneuve Loubet, France

[73] Assignee: Texas Instruments Incorporated, Dallas, Tex.

[21] Appl. No.: 606,362

[22] Filed: Feb. 23, 1996

[30] Foreign Application Priority Data

Feb. 23, 1995 [FR] France ................................. 95 02141

[51] Int. Cl.$^6$ ............................................. H02H 7/00
[52] U.S. Cl. ........................ 361/18; 361/84; 361/90; 361/115
[58] Field of Search .................................. 361/18, 82, 84, 361/115, 93, 91, 90, 92; 320/6, 31, 39

[56] References Cited

U.S. PATENT DOCUMENTS

| 3,867,682 | 2/1975 | Yamauchi | 320/39 |
| 4,006,397 | 2/1977 | Catotti | 320/31 |
| 4,281,277 | 7/1981 | Lakey | 320/6 |
| 4,777,387 | 10/1988 | Collins | 307/270 |
| 4,965,738 | 10/1990 | Bauer et al. | 364/483 |
| 5,545,491 | 8/1996 | Farley | 429/7 |

FOREIGN PATENT DOCUMENTS 0 545 747 A1   10/1992   European Pat. Off. ........... H02J 7/10
2219151        4/1989    United Kingdom .............. H02J 7/00

OTHER PUBLICATIONS

Patent Abstracts of Japan, vol. 007, No. 186 (E–193), Aug. 16, 1983 & JP–A–58 089866 (Hitachi Seisakusho KK), May 28, 1983, figures 2,3.

Primary Examiner—Jeffrey Gaffin
Assistant Examiner—Stephen Jackson
Attorney, Agent, or Firm—Gerald E. Laws; Richard L. Donaldson

[57] ABSTRACT

This device includes, connected in parallel with each of the elements (I, II), corresponding shunt regulators (S11, R11, S21, R21) linked together in series, and the control electrodes of which are connected to networks of resistors which represent voltages of the elements which can be applied to respective comparators (C11, C12, C21, C22) of the lower and upper threshold voltages (Vth11, Vth12, Vth21, Vth22) of the elements with a reference voltage delivered by a reference voltage source (Vref), a switching MOSFET transistor (4), with low conduction resistance and with defined off-state impedance, connected between the most negative terminal of the set of elements (II) in series and the negative terminal (Vbat−) of the protection device and means of control of the MOSFET transistor from output signals from the comparators (C11, C12, C21, C22) in order to alter the state of the said MOSFET transistor (4) for the purpose of regulating the state of charge and of discharge of the elements (I, II). It makes it possible to use a common charger for NiCd and NiMH elements.

19 Claims, 4 Drawing Sheets

LITHIUM ELECTRONIC-MECHANICAL AUTOMATIC PROTECTION SYSTEM (LEAPS)

The present invention relates to charge monitoring and protection devices for rechargeable battery elements.

It relates more particularly to an automatic charge monitoring device providing protection against overcharges, excessive discharges, excessive temperatures, short circuits and high currents at low resistance, particularly for rechargeable lithium elements.

It envisages, in particular:

the protection of rechargeable lithium elements against damage due to overcharging, the protection of rechargeable lithium elements against damage caused by excessive discharges, charge balancing in the course of the full charging of a set of several lithium elements, charge balancing at the voltage corresponding to complete element discharge for sets of several lithium elements, the provision of switches in series, with low operation resistance, the provision of a semiconductor switch which can also be used as a current-measuring element, mechanical and electronic safety with respect to excessive currents and temperatures for cells and electronic circuits, safety against overvoltages for battery modules, monitoring of the battery current in the event of a breakdown of one or more elements, integration of the electronics on a single chip which requires only a low quiescent current, the production of a protection device in the form of a module of small size, of low weight and of low assembly cost price, integration of the electronic and mechanical assembly into a single compact unit, the use, for charging lithium battery modules, of chargers which are normally used for charging NiCd and NiMH elements.

Hence its subject is a MOSFET-type field-effect transistor, characterized in that it comprises, on a substrate, an epitaxial layer of a first type and with a first level of conductivity, in which are formed a gate region of a second type and with a second level of conductivity and a drain region of the first type and with a third level of conductivity, a source region of the first type and with the same level of conductivity as that of the drain region being formed in the gate region, and in that a diode is formed by the drain region—epitaxial layer—gate backing region path, with an impedance defined in the source-drain direction when the transistor is turned off.

A further subject of the invention is a device for protecting rechargeable elements, characterized in that it includes, connected in parallel with each of the elements, corresponding shunt regulators linked together in series, and the control electrodes of which are connected to networks of resistors which represent voltages of the elements which can be applied to respective comparators of the lower and upper threshold voltages of the elements with a reference voltage delivered by a reference voltage source, a switching element with low conduction resistance and with off-state impedance, in one direction, of a near-infinite ohmic value and a defined off-state impedance in the other direction, connected between the most negative terminal of the set of elements in series and the negative terminal of the protection device and means of control of the MOSFET transistor from output signals from the comparators in order to alter the state of the said MOSFET transistor for the purpose of regulating the state of charge and of discharge of the elements.

The invention will be better understood on reading the description which will follow, given solely by way of example, and given by referring to the attached drawings, in which.

Figure 1:
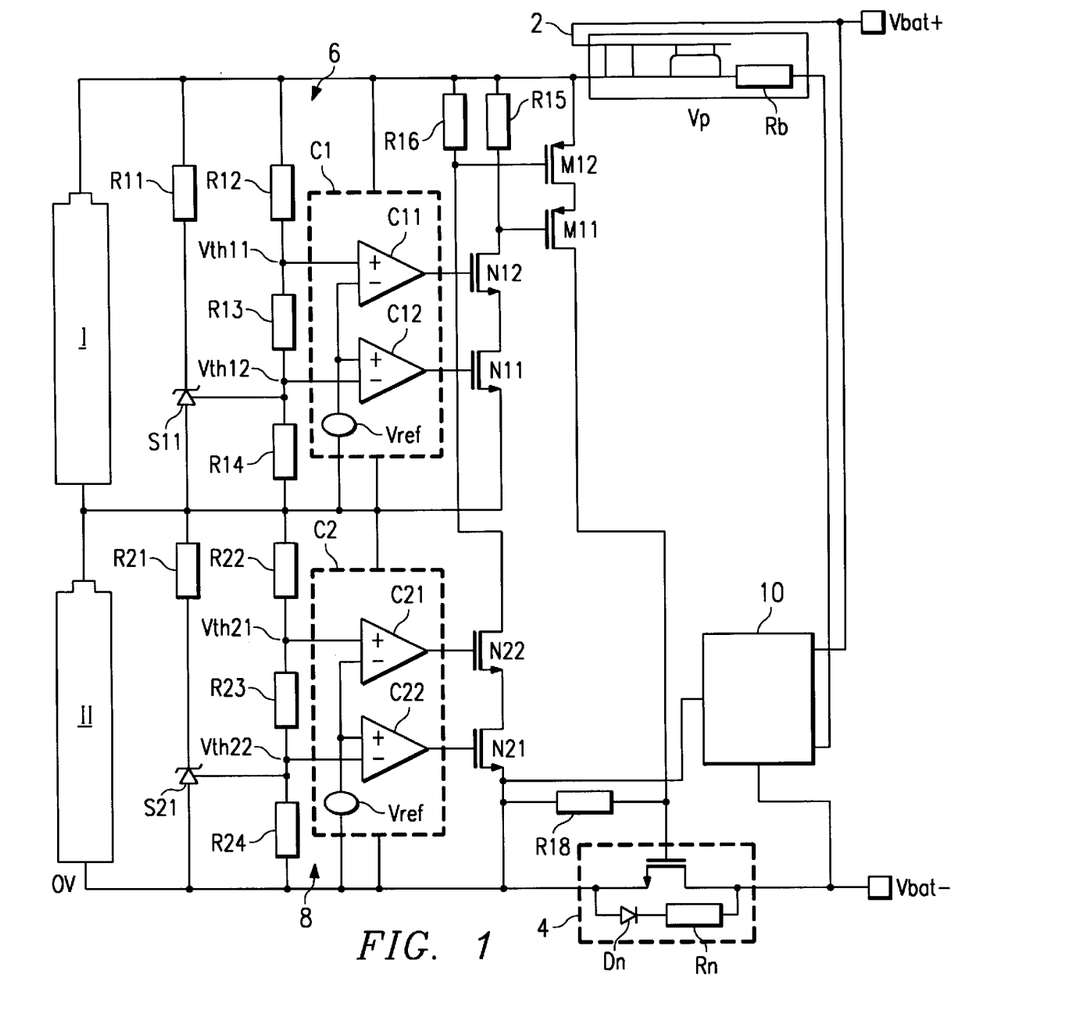
FIG. 1 is an electrical diagram of the protection device for elements in accordance with the invention.

The protection device for rechargeable elements which are represented in FIG. 1 consists of a mechanical protection unit 2 and of electronic circuit units 4, 6, 8 and 10. It is designed to provide protection for elements I, II, connected in series. The protection 30 device and the elements together form a protected battery module with terminals Vbat+ and Vbat– to which a charger or an application, or a charger-application combination can be connected.

With the aim of clarity, the hysteresis circuit, 35 the filtering circuits and the circuits for reducing the quiescent current when the elements have a low voltage are not represented.

The mechanical protection unit is a bimetallic strip switch 2 connected between the Vbat+ terminal and the most positive electrode of the series of elements, namely that of element I.

The most negative electrode of the series of elements, that is to say that of element II, is connected via a MOSFET power switching transistor 4, of specific construction, to the negative terminal. Vbat– of the battery module.

The bimetallic strip switch 2 is, for example, a protector from the Zmm miniature-bimetallic strip series manufactured by the company Texas Instruments Inc.

In place of a bimetallic strip 2, a positive temperature coefficient thermistor, made of polymer or ceramic, of special construction, may also be used.

The FET transistor 4 is in fact a power switching MOSFET transistor, which will be described by reference to FIG. 2.

Each of the elements I and II has a corresponding electronic circuit 6, 8 associated with it. The components of the circuits 6 and 8 which will now be described are designated by the same references, assigned the indices 1 or 2 respectively.

Thus, a shunt regulator S11, in series with a resistor R11, is connected to the terminals of the element I.

The control electrode of the shunt regulator S11 is connected to the junction point of two resistors R13, R14 which are connected in series with a resistor R12, forming a resistor chain also connected in parallel with the terminals of the element I.

The circuit 6 associated with the element I further includes a comparator assembly C1 itself also connected in parallel with the terminals of the element I. It includes two voltage comparators C11, C12 each having two inputs and a temperature-stable reference voltage source Vref.

The positive input of the comparator C11 is connected to the junction of the resistors R12, R13 and the negative input of the comparator C12 is connected to the junction of the resistors R13 and R14.

The negative input of the comparator C11 and the positive input of the comparator C12 are both connected to the reference voltage source Vref. The output of the comparator C11 is connected to the gate of a FET transistor N12, while the output of the comparator C12 is connected to the gate of a FET transistor N11.

The sources and the drains of the FET transistors N12 and N11 are connected in series with a resistor R15 which is connected to the positive terminal of the element I.

The circuit 8 associated with the element II includes the same components as those of circuit 6 which are assigned the index 2.

The source-drain paths of the transistors N22, N21 which are associated with the comparators C21, C22 of circuit 8 are connected in series with a resistor R16, and this chain is linked in parallel with the set of two elements I and II.

The resistor R15 in series with the transistors N12 and N11 is connected to the gate of a FET transistor M11, while the resistor R16 which is linked in series with the transistors N22 and N21 is connected to the gate of a FET transistor M12.

The source-drain paths of the transistors M11, M12 are connected in series between the positive terminal of the element I and the gate electrode of the power MOSFET transistor 4.

The source-drain path of the MOSFET transistor 4 is connected between the negative terminal of the element II and the Vbat-terminal of the battery module.

A resistor R18 is connected between the source and the gate of the MOSFET transistor 4 and keeps it normally turned off. The shunt voltage regulators S11 and S21 use the resistors R11, R21 in series in order to limit the heating of these regulators while not affecting their regulation function, these resistors also providing current limiting during the low-voltage charge balancing and during certain operations with abnormal settings of element voltages.

Figure 1A:
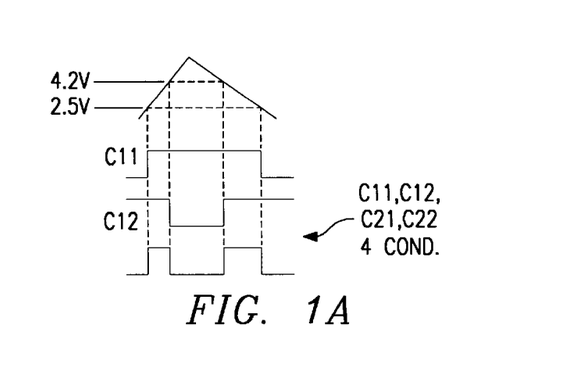
FIG. 1a is a diagram representing the waveform of an element and the output signals from the corresponding comparator of the device of FIG. 1.

The comparator units C1, C2 together with the resistors R15, R16 and the transistors N11, N12, N21, N22 produce an element voltage window within which the MOSFET power transistor 4 is kept turned on; the waveforms are illustrated in FIG. 1A.

The comparator units C1, C2, together with the resistors R12, R13, R14, R22, R23, R24 and the shunt regulators S11, S21 regulate the maximum and minimum voltages at which shunting of the element currents occurs.

The MOSFET transistor 4 is represented in FIG. 1 by a drain-source region, a gate electrode and a diode Dn in series with a resistor Rn, and this series impedance is represented as being connected between the drain and the source of the MOSFET transistor 4.

Between the bimetallic strip 2 and MOSFET transistor 4, an electronic protection circuit 10 is connected, which also forms part of the integrated circuit of the protection device.

A resistor Rb is present within the bimetallic emit in such a way that there is good thermal contact with it.

The protection circuit 10 switches a current through the resistor Rb on detection of a defect in operation of the power devices by determining an excessive voltage drop across switching device 4 or on detection of an excessive temperature of the whole of the integrated circuit.

The effect of the current passing through the resistor Rb is to heat the bimetallic strip, causing it to open. It may be designed to remain open after the passage of a hold current through the positive-temperature-coefficient resistor of the bimetallic strip, the latter closing only when the charging current is cut off.

The Zmm protection devices from Texas Instruments Inc. operate in this way.

In place of the resistor Rb, it is equally possible to use a positive-temperature-coefficient thermistor made of polymer or of ceramic which can cause the bimetallic strip to open or activate the PTC thermistor.

Figure 2:
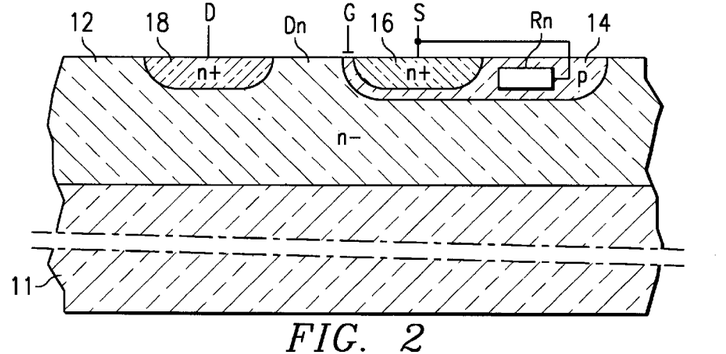
FIG. 2 is a diagrammatic view in section of the structure of the novel nMOSFET field-effect transistor used in constructing the protection device of FIG. 1.

The MOSFET transistor 4, the structure of which is represented in FIG. 2, comprises a substrate 11 on which an n- doped epitaxial layer 12 is obtained by growth.

Into the epitaxial layer 12 a p region 14 is diffused for the gate, into which an n+ source region 16 is also diffused. The same n+ dopant is simultaneously diffused into the epitaxial layer itself in order to form the drain electrode 18.

The resistance Rn of the transistor 4 is defined either by the p dopant of the gate backing and an epitaxial n-dopant, or by forming an appropriate connection between the source 16 and gate backing 14 so as to define a resistance essentially defined by the p dopant of the gate backing, or by choosing an appropriate resistor connected between the source and the gate backing which would be outside the p region. In all cases, it is appropriate, in the construction of the MOSFET transistor 4, to take care to avoid any turning-off of the device caused by transient voltages when the transistor 4 is turned on and turned off. A MOSFET transistor with a p type substrate 11 may be predisposed to such a phenomenon.

The n+ drain region 18 is diffused beside the gate region 14.

The diode Dn includes the gate p region 14 as its anode, and the n- region of the epitaxial layer 12 as its cathode.

The FET transistor 4 described is an nMOSFET and, by virtue of a careful configuration and by maximizing the width/length ratio (W/L) of the channel, a MOSFET transistor with very low conduction resistance can be produced. It is possible additionally to produce a heavily doped buried layer below the epitaxial layer 12.

If the doping of the buried layer is of n type, this layer increases the conductivity and limits the spurious vertical transistor action when the substrate is of p type.

The high W/L ratios with a minimum device dimension may additionally be obtained by using double-diffusion techniques with auto-alignment, which gives very small gate lengths.

The FET transistor 4 is held normally turned off by the resistor R18 connected between its source S and its gate G (FIG. 1). The outputs of the comparators C1 and C2 switch the FET transistor 4 so as to make it conduct the battery current whenever all the voltages of the elements are in their charge and discharge state in safety operating mode.

The FET transistor 4 is proposed as a novel type of FET transistor, especially designed for application to the battery protection device in module form.

The characteristics of the FET transistor and its novel reverse blocking characteristics are defined by the relationship:

| Vtb – phi(metal – Si) + 2Phi(f) – Qox/Coxg + Qb/Coxg + Qimplant/Coxg | | | | |
|---|---|---|---|---|
| metal-silicon work function | surface potential on setting up a strong inversion | fixed oxide charge | overall charge under gate to be depleted | setting-up charge Vt implantation |

Vto is the threshold voltage of the transistor 4 when its source is connected directly to the gate backing.

The source S 16 is normally electrically connected to the gate backing in order to avoid modulation of Vt which would result from the overall effect of the gate backing.

When a voltage Vsb exists between the source and the gate backing, the resultant alteration in Vt can be defined as:

$$Vt=Vto+Delta(Vt)$$
$$=Vto+(Sqrt(2Esi*q*Nsub))/Coxg+Sqrt(2Phi(f)+Vsb)-Sqrt(2Phi(f))$$
$$=Vto+Gamma+Sqrt(2Phi(f)+Vsb)-Sqrt(2Phi(f))$$

Gamma is called the body-effect parameter; Esi, q, Nsub, Vsb represent the permittivity of the silicon, the value of the charge on the electron, the doping level of the gate region and the source-gate backing voltage respectively.

The new switch holds the conduction voltage threshold at Vt, while using the diode Dn and the resistance Rn in order to define the reverse off-state impedance Zoffsd; the forward off-state impedance Zoffds remains like that of a FET transistor with normal turnedoff state, that is to say close to an infinite ohmic value.

Zoffsd=Zdiod+Rn

Zoffds→∞

When the battery elements are in their normal operating voltage window, the FET transistor 4 is switched so as to operate in its triode region, $$Id=K'(W/L)(Vgs-Vt)Vds-(\frac{1}{2})(Vds"''2)$$

K' and W/L represent the mobility constant and the width-to-length ratio for the channel of the FET respectively.

This shows that for low Vdrain-source (Vds) voltages in this region, the MOSFET has a resistance characteristic for a constant gate-source voltage.

In order to obtain the lowest conduction resistance Ron, the lowest voltage Vt is required for a given voltage Vgs.

It is proposed:

1) to use Vto by connecting the source 16 to the gate backing when the MOSFET 4 is conducting, which gives the minimum Vt voltage;
2) to put a gate backing contact in place so as to obtain a resistor Rn (of 10 to 500 ohms for the application of the protection device of the invention, or depending on the requirements of the system) in series with the diode Dn;
3) to use a constant voltage on the gate, so that a voltage drawn from a potential barrier allows the MOSFET, when it is turned on, also to be used as a current detection resistor in systems in which battery current measurements are required. The absolute value and the characteristic parameters of this resistor can be stored in a non-volatile memory of the battery module.

Another means for defining the resistor Rn consists in having a four-terminal MOSFET in which the gate backing is brought out as a separate terminal (while having a parallel resistor on the integrated circuit chip connected between the source 16 and the gate backing so as to keep the condition Vto and to avoid turning-off in the course of switching transitions).

This makes it possible to arrange a diode and a resistor in series, outside the MOSFET, which will define the reverse impedance of the device.

That being so, the MOSFET transistor 4 is, in the present example, a novel MOSFET power transistor of n polarity, having a very low conduction resistance and an off impedance approaching infinity in the normal off direction, and having a value determined by the diode Dn and the resistor Rn in the reverse off direction.

It is designed for the protection device according to the invention.

The value of the resistor Rn determined by the maximum voltage reached by the charger in the course of operation and by the level of the current chosen for charge balancing.

Figure 3:
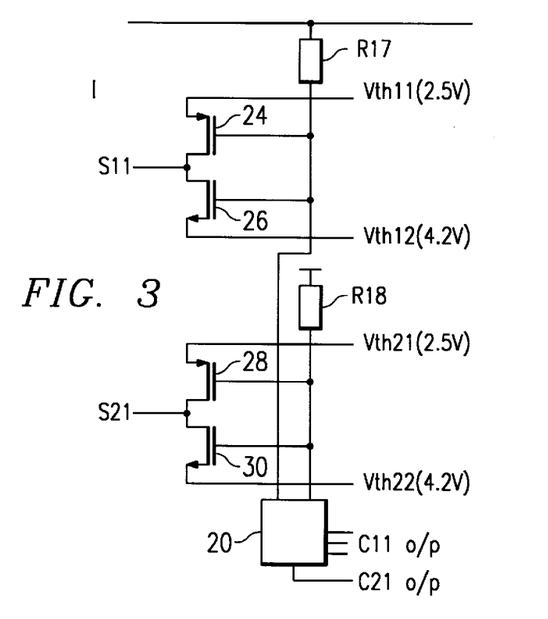
FIG. 3 is an electrical diagram of a detailed plan of the logic used to select the balancing of the high or low charge levels.

The logic circuit of FIG. 3 is intended to select a low-voltage shunting or a high-voltage shunting as a function of the voltages of the elements.

The voltage balancing control logic circuit represented in FIG. 3 includes a resistor R17 connected to a set of logic elements 20 including inputs connected respectively to the comparators C11 and C21.

Two FET transistors 24, 26 are used to connect the input electrode of the shunt regulator S11 to Vth11 or Vth12, which defines when shunting at minimum and maximum element voltages has to be carried out.

They are assigned to the element I and have their source-drain paths connected in series between the points Vth 11 and Vth 12 which define minimum and maximum safe operating thresholds for the element I.

The drains of the FET transistors 24, 26 are connected to the control electrode of the shunt regulator S11.

The gates of these transistors are both connected between the resistor R17 and the set of logic elements Two FET transistors 28, 30 are used to connect the input electrode of the shunt regulator S21 to Vth21 or Vth22 which define when shunting at minimum and maximum element voltages has to be carried out for the element II.

They are allocated to the element II and have their source-drain paths connected in series between the points Vth 21 and Vth 22 which define minimum and maximum safe operating thresholds for the element II.

The drains of the FET transistors 28, 30 are connected to the control electrode of the shunt regulator 21.

The gates of the FET transistors 28, 30 are connected between a resistor R18 linked to the positive terminal of the element I and the set of logic elements 20.

Figure 4:
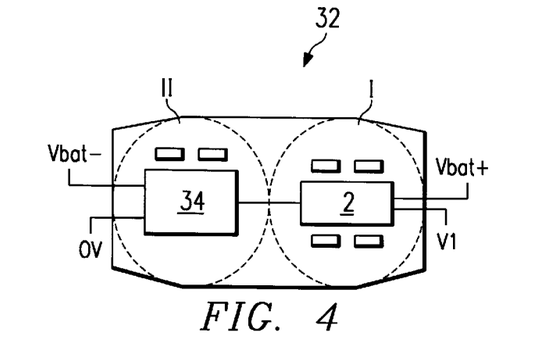
FIG. 4 is a diagrammatic plan view of an example assembly of the protection device, with elements to be protected.

FIG. 4 shows a circuit board on which the bimetallic strip element 2 and an integrated circuit 34 comprising the circuits 4, 6, 8 and the electronic protection circuit 10 described by reference to FIGS. 1 and 3 appear side by side. The cross-sections of the elements I and II are represented in broken lines. These elements are contained within the dimensions of the printed circuit board 32.

The electronic circuit of the protection device according to the invention is produced in the form of a single integrated circuit chip using linear MOS power technology, developed by the Applicant and designated by the title TI-PRISM, as well as Lin-Bi-CMOS technologies.

The circuit 34 and the bimetallic strip 2 may be placed in a single plastic casing.

The protection system represented in FIG. 1 is intended for a battery module formed by two elements, but it may easily be extended to a greater number of elements given that the technology of the integrated circuits is capable of withstanding the maximum voltages required.

It will also be understood that such a protection system can be applied to a single rechargeable element.

The operation of the protection system will now be described by considering the various operating regions.

By way of example, lithium-ion elements having operating voltage limits of 2.5 volts and 4.2 volts are used to illustrate the operating principles of the system. The hystereses, the filtering of transients, the delay circuits and the quiescent-current reduction circuits are ignored for the sake of clarity of, the explanations.

Region 1: Elements having undergone excessive discharge, Vcell≦2.5 V a) for less than 1.5 volts, the current of the elements is switched to 0 by the electronic circuit;

b) when the voltage of each element I, II is less than 2.5 volts, the shunt regulators S1, S2 are turned off. No discharge current can therefore flow through the MOSFET transistor 4 or through the diode Dn which is in the off-direction for discharge currents;

c) when the voltage on any one of the elements I and II is less than 2.5 volts, the shunt regulators of the remaining elements, the voltages of which are greater than 2.5 volts, are set so as to shunt them at 2.5 volts; this balances all the elements at 2.5 volts;

d) when a charger is connected to the Vbat+, Vbat− terminals of the battery module, the MOSFET transistor 4 remains turned off, but a current limited by the resistor Rn flows through the elements by means of the diode Dn and of the resistor Rn;

e) then, when all the elements have reached 2.5 V, the shunt regulators S11, S21 are reset to shunt the currents at 4.2 V;

Region 2: Elements being within their normal operating ranges, 4.2 V>V element>2.5 V a) when the voltages of all the elements are greater than 2.5 V, the shunt regulators are all set to shunt the current above 4.2 V per element;

b) when all the elements I, II are in this voltage region, the MOSFET transistor 4 is turned on and has a very low resistance in series for the charge and discharge currents;

c) for a battery module comprising a single element, or when the voltage available to switch the MOSFET transistor 4 is not sufficiently high for this transistor to reach the low conduction resistance Ron required, a charge pump can amplify the potential-barrier reference voltage up to the high gate-source voltage necessary for it to exhibit a very low conduction resistance. A constant gate-source voltage also gives the MOSFET transistor a resistance characteristic allowing it to be used as a current detection resistor.

Region 3: Overcharge voltage V element>4.2 a) the shunt voltage regulators S11 and S21 are respectively turned on when V element I or V element II reaches 4.2 V, and b) the output of the comparators C11 or C12 no longer keeps the MOSFET transistor 4 turned on; it consequently resumes its normal off state. Any element situated above 4.2 V switches the MOSFET transistor so as to turn it off;

c) when the charger (not represented) is connected to the battery module, its current is consequently limited to the resistor Rn and the diode Dn, and this is so only when the elements have reached 4.2 V. Charge balancing takes place when the elements below 4.2 V continue to be. charged with a reduced current; eventually all the elements will be charged to 4.2 V and all the shunt regulators will conduct the reduced charging current through the diode Dn and the resistor Rn back to the charger;

d) when the charger is withdrawn, the elements will be in their operating voltage region (2.5 V–4.2 V) and the MOSFET transistor 4 will be kept turned on so that the charge and discharge currents flow in the lowresistance triode region.

Region 4: Fault conditions a) in the improbable event of the MOSFET transistor 4 being short-circuited because of a defect, and of a defect condition short-circuiting the terminals of the battery module, the bimetallic strip element 2 opens and remains in this state until the defect condition has been eliminated: from the battery module;

b) if an abnormally high current flows through the elements and places the MOSFET transistor 4 outside its safe operating range or causes the integrated circuit to reach an abnormally high temperature, the electronic protection circuit applies a low voltage to the resistor Rb associated with the bimetallic strip element so that the current induced through it causes it to heat up sufficiently to open the bimetallic strip switch;

c) the protection circuit opens the bimetallic strip when it detects a battery module voltage Vbat−−Vbat− greater than a predetermined value;

d) if all the electronic control means (MOSFET transistor 4, charger, electronic protection) suffer a breakdown in the course of rapid charging and if the elements I and II reach a high temperature, the bimetallic strip element operates as a backup mechanical safety protection device and stops the current flowing in the battery module;

e) if an element suffers a breakdown (element I or II) the broken-down element exhibits a voltage lower than 2.5 V and consequently switches the MOSFET transistor 4 so as to turn it off, thus interrupting the flow of high currents through the battery module. The other elements will thus be slowly discharged by the shunt regulators and, in this case, the resistors R12, R22 will limit the strength of the discharge currents.

Figure 5:
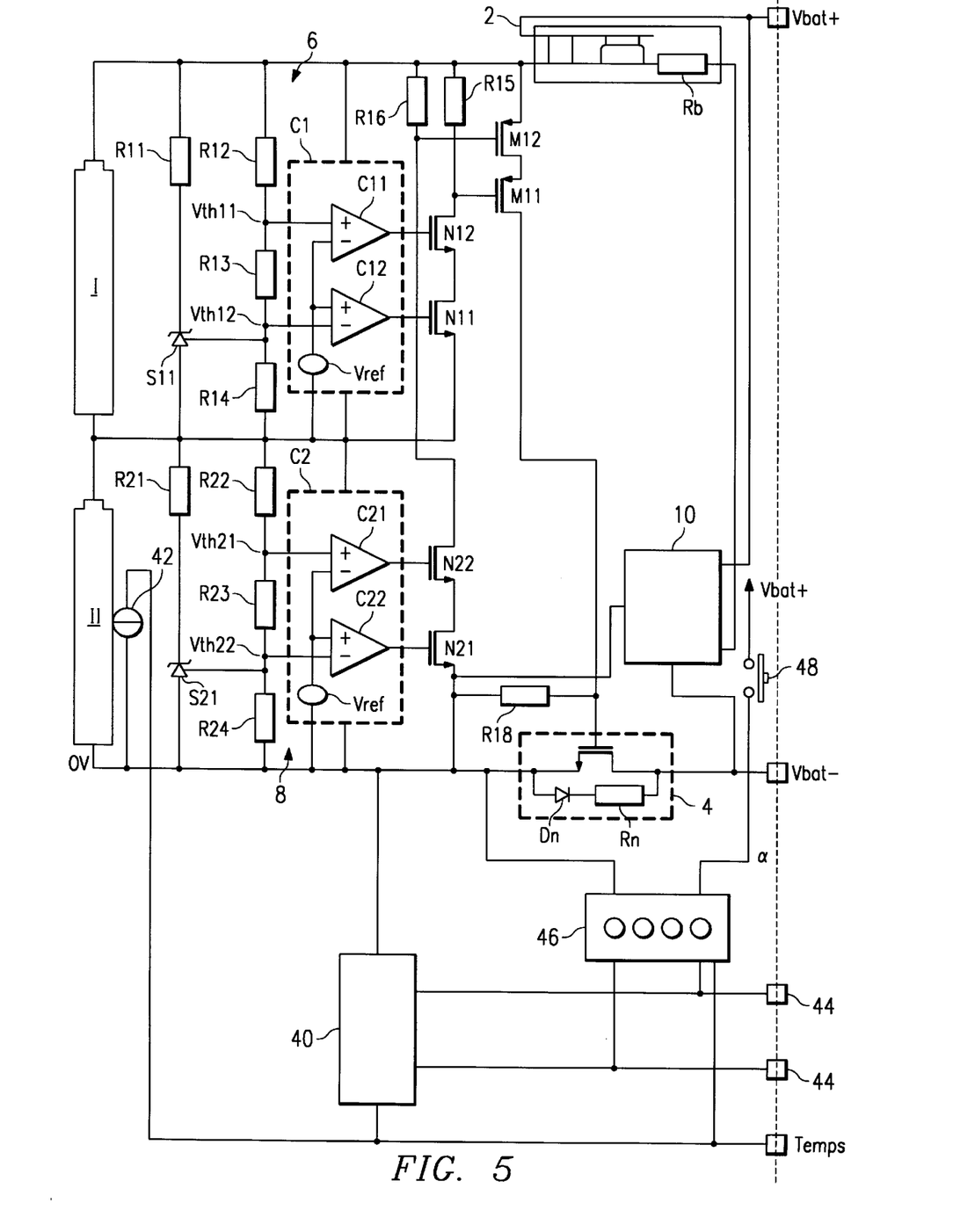
FIG. 5 is an electrical diagram of another embodiment of the protection device for elements according to the invention, with a charge state indicator.

The circuit represented in FIG. 5 consists of a first part for forming the circuit of FIG. 1, the components of which hear the same reference numbers and which will therefore not be described again, and a second part comprising a non-volatile memory such as an EEPROM 40, the positive power supply terminal of which is connected to a temperature sensor 42 which is in a heat-exchanging relationship with the elements I and II.

The output of the memory 40 is connected to the terminals 44 of the battery module and also to a display module 46 comprising circuits with a high time constant for display, voltage and temperature measurement, and The power supply voltage for the EEPROM memory 40 and the temperature sensor can be taken from a common terminal temps.

The display module 46 is connected to the Vbat+ terminal via a charge-state display switch 48.

The non-volatile memory 40 makes it possible to store battery charge state parameters for the elements I, II at the instant corresponding to the charge state.

The display module contains certain electronic means for measuring the voltage and the temperature of the elements and for reading the charge state data contained in the memory 40. It determines the charge level of the elements to be displayed with low resolution, for example a 4-level LED assembly. Precise metering of the charge state is therefore not necessary for such display units on a module. When the display switch 48 is pushed in, a charge state based on a look-up table in the memory, with temperature-corrected voltage listings, will suffice for the display.

Figure 6:
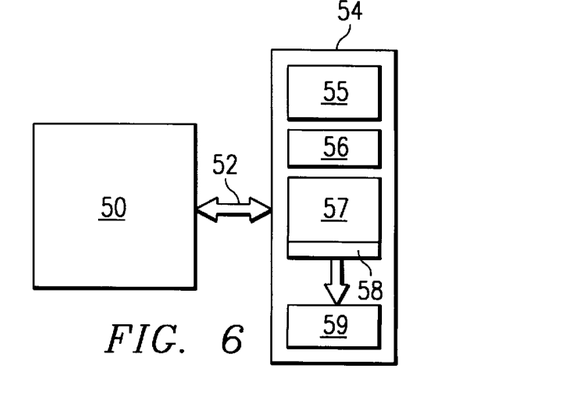
FIG. 6 is a battery management flow chart with a protection device according to the invention.

The flow chart represented in FIG. 6 shows the protected battery module with a charge state indicator on the module, interfacing with an application 50 comprising a charge-measurement circuit. The charge management application circuit comprises a charge-measuring algorithm, components for taking precise measurements of charge state, a real-time clock and a data bus 52 between the application and the battery module 54. The battery module contains elements 55, the protection device 56 and a non-volatile memory, for example an EEPROM memory 57 which holds:

a real-time reference and a temperature, a voltage, a corresponding current and a corresponding charge state charge, discharge coefficients and other charge determination parameters.

The EEPROM memory 57 is connected to a display interface circuit 58 which is connected to the charge state display device. The interface circuit and the display unit are used only if a charge state display option on the module is necessary.

Figure 7:
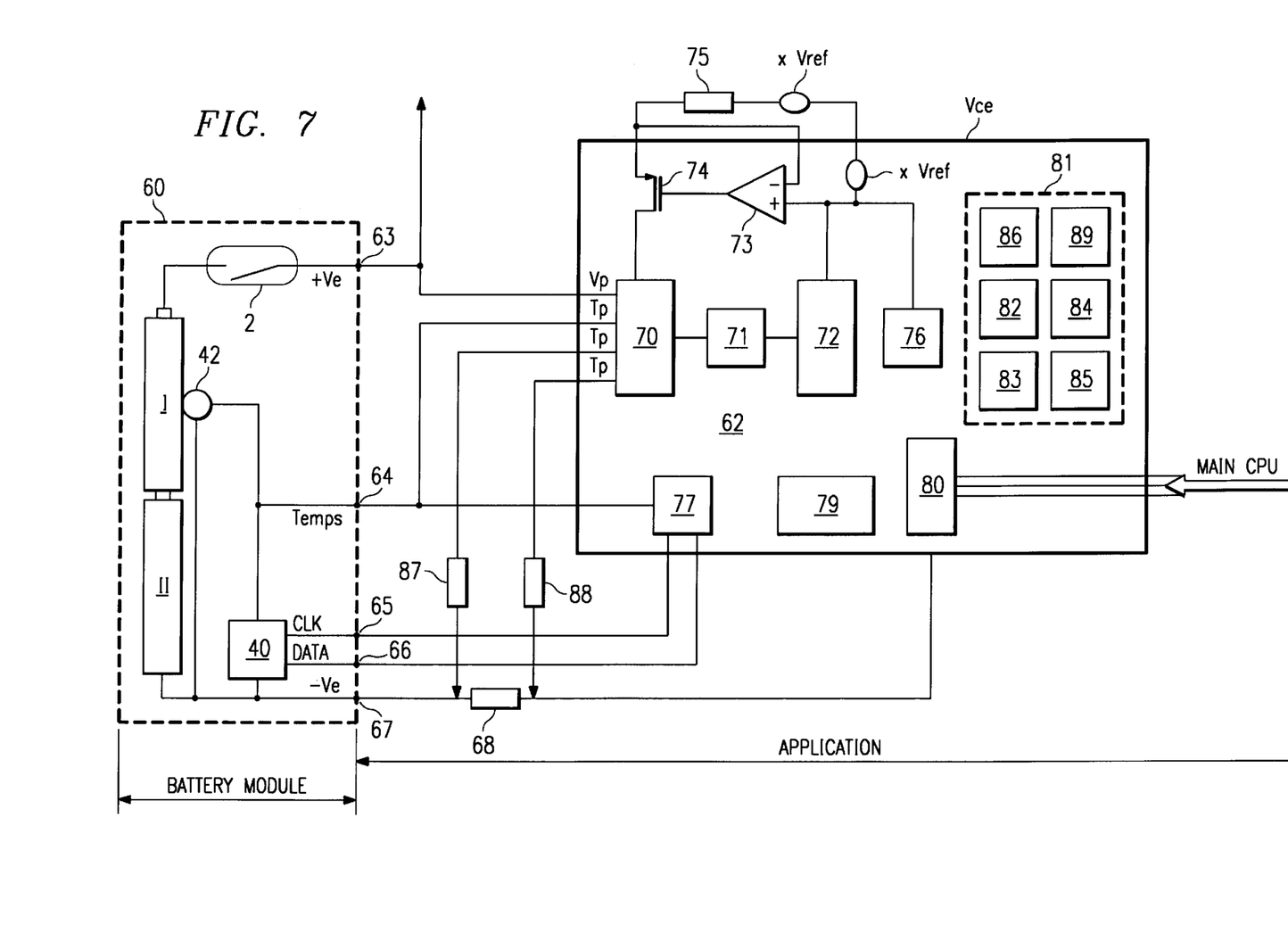
FIG. 7 is a diagram of a cheap battery module with a charge state memory applicable to elements of different chemical natures, in which protection against overvoltages and undervoltages is not mandatory, this diagram also showing an example of an interface of a function of management by an application.

A system for charge measurement by the application is represented in FIG. 7, and is applicable to a low-cost battery module 60 as well as to the battery module of FIG. 5.

The low-cost battery module 60 comprises elements I and II, the EEPROM memory 40, to which is connected the temperature sensor 42 and the mechanical protection bimetallic strip switch 2. This battery module 60 can be used to hold the charge state data of a set of elements. These can be sets of NiCd, NiMH, etc elements. The description which will follow applies both to the battery module system represented in FIG. 5 and in FIG. 7.

The EEPROM memory 40 is fed by the microprocessor 62 when the battery module is connected to the application. Consequently, it draws no current from the elements I and II even when it is not connected to the application. The charge state data, and other data, can be passed through the main processor (not represented) by the charge management microprocessor 62 through the data bus interface 80. The main processor can then be capable of carrying out the energy management functions for the application.

The protected battery module 60 is connected to the microprocessor 62 by five terminals 63 to 67.

Terminal 63 is the positive connection of the elements via the bimetallic strip 2, and is the positive energy terminal for the application of the charger.

Terminal 64 is the temperature detection terminal for the elements I and II and can be shared with the power supply for the non-volatile memory 40.

Terminals 65 and 66 are clock and data terminals forming an interface bus, for example Inter-Integrated Circuits Bus (I$^2$C), between the non-volatile memory 40 and the application.

Terminal 67 is the terminal for connecting the negative terminal of the battery module and a current detection resistor 68 associated with the microprocessor 62 of the application.

The analogue inputs multiplexer 70 of the microprocessor 62 are inputs for voltage Vp relating to the battery voltage Ve, for voltage relating to the temperature Tp of the element, and for current Ip of the elements.

These are multiplexed in the circuits 70 and 71 so as to be sent to a high-resolution analogue-digital converter 72.

A multiple of the potential barrier stabilized voltage reference 76 of the analogue-digital converter is connected to the non-inverting input of an operational amplifier 73, the output of which is connected to the gate of a FET transistor 74. The inverting output of the amplifier 73 is connected to the source of the FET transistor 74 and to a resistor 75. The other end of the resistor 75 is connected to a higher multiple of the potential barrier voltage.

The components 73, 74, 75 form a current source.

The FET transistor 74 delivers a constant current via multiplexer 70 which is used to give a voltage shift determined by the product of the constant current and of a resistance value 87, and when it is connected to a resistor 88 via multiplexer 70, the product of the constant current and of the value of the resistor 88. Due to the voltage. shift obtained, the charge and discharge currents can be controlled from voltage measurements at the terminals of the current detection resistor 68. The current source and the analogue-digital converter use the same potential barrier voltage reference giving a system ensuring accurate measurements.

The terminal 64 of the battery modules 60 may be connected to one of the universal input-output I/O terminals 77 of the charge measurement microprocessor 62. Equally, two other input-output I/O terminals 77 are connected to the terminals 65 and 66 of the non-volatile memory of the battery module for the operation of the clock and of the CLK and DATA informations according to a protocol Inter-Integrated Circuits Bus (I$^2$C) for example.

The microprocessor 62 also has a local oscillator 79, communication bus for communicating with the main computer, not represented, of the application, and other units necessary for its operation such as a ROM memory 82, a RAM memory 83, a central processing unit and timing means 85, as well as resetting means 86 and a real-time watchdog interrupt device 89.

By virtue of the microprocessor-type charge measuring configuration described above, management of the elements I and II of a battery can be controlled by the charge management processor of an application, and the charge state and other battery data can be sent to the main computer for the purpose of displaying them and managing the energy of peripherals of the application.

The charge measuring configuration is also characterized in that it includes a voltage- and temperature-measuring circuit and a circuit with high time constant capable of being reset to zero which is comparable in time with the time for setting the oxidation-reduction potential, which can display the latter state of charge written into the memory (40) by an application, or after the recycling of the oxidation-reduction period, a state of charge corresponding to the voltage and to the temperature read when a charge changeover switch of the battery module is actuated.

The differences between the solution of a battery module and of its charge state monitoring according to the invention and of other solutions previously proposed in this field are as follows:

a) the use of a single power switch, such as the nMOSFET component 4. This exhibits a conduction resistance equal to half of that of existing solutions with two FETs;

b) the effects of losses of energy and of high temperatures for high-current applications such as portable computers, portable GSMs in which the currents coming from the battery module may reach 5 amps, are greatly reduced. At 100 mohms, (for example in present-day systems using a PTCR protection element with cold resistance of 50 mΩ and two power MOSFETs each of 25 mΩ), 2.5 watts are dissipated; the protection system of the invention aims to reduce that by at least half. (For example, Rbimetallic strip+R MOSFET<50 milliohms).

The MOSFET can be designed with a constant gatesource voltage when it is used as detection resistor in systems requiring charge state indication. This further entails lower losses of energy from the battery and lower heat dissipation from the system;

c) no short-circuit protection fuse is necessary, as such a system is generally used with protection systems made from polymer or from ceramic with a positive temperature coefficient. This further lowers the energy losses as well as the number of components and the overall cost of the battery module;

d) the bimetallic strip exhibits the action of a reusable fuse;

e) a novel MOSFET which has a very low conduction resistance and an off resistance which is close to an infinite value in the forward direction and an off impedance defined in the reverse direction;

f) the shunt regulators S11, S22 are used to balance the charge at high and low voltage levels and to avoid overcharges;

g) the bimetallic strip 2 has a lower conduction resistance than protection devices with a positive temperature coefficient; the drift of the resistance over time is also improved;

h) the bimetallic strip element proposed has a resistor Rb through which a heating current can be applied so as to open the path of the main battery current;

i) electronic protection detects the safety parameters for operation of the integrated circuit (temperature, excessive currents and battery voltage); when such a situation is detected, it causes a current to pass through the resistor Rb in such a way as to interrupt the passage of battery current;

j) this protection system can evolve towards a single protection unit which comprises mechanical and electronic components.

As far as the charge state memory and the optional device for displaying the charge state, such as that represented in FIG. 7, are concerned, it is also applicable to a low-cost battery module 60 with elements of any chemical nature;

k) the non-volatile memory is incorporated in the battery module and used to hold battery parametets, charge state data and corresponding time measurement, date, voltage, current and temperature data;

l) the light-emitting diode display module includes a corresponding electronic circuit for reading the data and the charge state table from the non-volatile memory, making temperature-corrected voltage readings with a view to display by means of an LED three- or four-level unit when a request is made by pressing in the switch 48 of FIG. 5. Accurate charge measurements are taken by the application each time the battery module is connected to the application, then written regularly into the non-volatile memory;

m) the power supply voltage and the non-volatile memory in the battery module can be shared with the temperature sensor. This avoids consumption of current from the elements and provides interfacing levels at correct voltage between the non-volatile memory and the charge measuring microprocessor 62 of the application.

During the temperature measurements, the non-volatile memory is placed in its power supply cut-off state. The current it consumes, for example of the order of a few microamperes, is sufficiently low as not to affect the accuracy of temperature measurement;

n) the battery module 60 becomes very cheap because of the low complexity of its circuits. The charge measurement functions are carried out by the application.

I claim:

1. A battery module, comprising:

two rechargeable elements (I,II);

a protection circuit for protecting the rechargeable elements, the protection circuit further comprising: connected in parallel with each of the elements (I; II), corresponding shunt regulators (S11, R11, S21, R21) linked together in series, and the control electrodes of which are connected to networks of resistors which represent voltages of the rechargeable elements which can be applied to respective comparators (C11, C12, C21, C22) of the lower and upper threshold voltages (Vth11, Vth12, Vth21, Vth22) of the rechargeable elements with a reference voltage delivered by a reference voltage source (Vref), a bi-directional switching element (4) with low conduction resistance and with off-state impedance in one direction of a near-infinite ohmic value and a defined off-state impedance in the other direction, connected between a most negative terminal of the set of rechargeable elements (II) in series and a negative terminal (vbat−) of the battery module and means of control of the switching element from output signals from the comparators (C11, C12, C21, C22) in order to alter the state of the said switching element (4) for the purpose of regulating the rate of charge and of discharge of the rechargeable elements (I, II).

2. Protection circuit according to claim 1, further comprising a constant gate-source voltage control means giving the MOSFET transistor (4) a resistance characteristic making it possible to use it as a current-detecting element in systems for measuring state of charge.

3. The protection circuit according to claim 1, further comprising a selection logic circuit (20, 22, 24, 26, 28, 30) for low- and high- voltage charge balancing, using the output signals from the comparators (C11, C12, C21, C22), which are driven logically in order to control the control electrodes of the shunt regulators (S11, S21).

4. The battery module according to claim 1, further comprising a non-volatile memory (40) for storing time and date data corresponding to the state of charge of the elements (I, II), and other parameters of the elements (I, II) relative to the technology of the elements and to the charge and discharge characteristics, the said memory (40) being connected to a temperature sensor (42), the said memory (40) and the said temperature sensor (42) being supplied with voltage by a common source (Vcc) external to the device.

5. The battery module of claim 1, further comprising an automatic charge control means making it possible to charge the battery module with a common charger for NiCd or NiMH rechargeable elements.

6. The battery module of claim 1, further comprising a thermal protection element (2) connected between a positive terminal (Vbat+) of the battery module and a positive terminal of the set of rechargeable elements (I, II).

7. The battery module of claim 6, wherein the thermal protection device is a bimetallic strip.

8. The battery module of claim 6, wherein the thermal protection device is a thermistor device with a positive temperature coefficient, made of polymer or ceramic.

9. The battery module according to claim 6, further comprising an electronic protection circuit (10) connected to the power supply terminals (vbat+, vbat−) of the module, wherein the electronic protection circuit is operable to actuate the thermal protection device in response to a detected condition and thereby interrupt current flowing to or from the battery module.

10. The battery module according to claim 9, further comprising a device (46) for displaying the state of charge according to the data contained in the memory (40) under the control of a charge-state switch (48).

11. The battery module according to claim 10, further comprising a voltage- and temperature-measuring circuit and a circuit with high time constant capable of being reset to zero which is comparable in time with the time for setting the oxidation-reduction potential, which can display the latter state of charge written into the memory (40) by an application, or after the recycling of the oxidation-reduction period, a state of charge corresponding to the voltage and to the temperature read when a charge changeover switch of the battery module is actuated.

12. A battery module, comprising:
one or more rechargeable elements;
a protection circuit for protecting the rechargeable elements, the protection circuit further comprising:
a bi-directional switching element with low conduction resistance and with off-state impedance in one direction of a near-infinite ohmic value and a defined off-state impedance in the other direction, connected in series with the one or more rechargable elements and a terminal of the battery module; and
control circuitry connected to a control terminal of the bi-directional switching element operable to alter the state of the the switching element for the purpose of regulating the rate of charge and of discharge of the one or more rechargeable elements.

13. The battery module of claim 12, further comprising an automatic charge control means making it possible to charge the battery module with a common charger for NiCd or NiMH rechargeable elements.

14. The battery module of claim 12, wherein:
the bidirectional switching element is a MOS device; and
the protection circuit further comprises a constant gate-source voltage control circuit connected to a gate and source of the bi-directional switching element, the bi-directional switching element having a resistance characteristic such that the bi-directional switching element is operable as a current-detecting element.

15. The battery module of claim 12, wherein the protection circuit further comprises a mechanical protection element connected in series with the one or more rechargeable elements and the terminal of the battery module, the mechanical protection element being operable to interrupt a current flowing through the one or more rechargeable elements in response to one of the rechargeable elements having an abnormally high temperature.

16. The battery module of claim 15, wherein the protection circuit further comprises an electronic protection circuit connected to the mechanical protection element, the electronic protection circuit being operable to sense an abnormally high current flowing through the bi-directional switching element and to cause the mechanical protection element to interrupt current flowing through the one or more rechargeable elements.

17. The battery module of claim 12, further comprising a non-volatile memory (40) for storing parameters relative to the technology of the one or more rechargeable elements and relative to the charge and discharge characteristics corresponding to the state of charge of the one or more rechargeable elements.

18. The battery module according to claim 17, further comprising a device for displaying a state of charge according to the data contained in the non-volatile memory.

19. The battery module of claim 18, further comprising a voltage- and temperature-measuring circuit.

* * * * *